(12) United States Patent (10) Patent No.: US 6,336,198 B1
Yu et al. (45) Date of Patent: Jan. 1, 2002

(54) CHIP TESTING SYSTEM

(75) Inventors: Chung-Pang Yu, Yi-Lan Hsien;
Kuo-Ping Liu, Pin-Tung Hsien;
You-Ming Chiu, Hsin Chuang, all of (TW)

(73) Assignee: Via Technologies Inc., Taipei (TW)

( * ) Notice: Subject to any disclaimer, the term of this patent is extended or adjusted under 35 U.S.C. 154(b) by 0 days.

(21) Appl. No.: 09/276,652

(22) Filed: Mar. 26, 1999

(51) Int. Cl.[7] .......................... G01R 31/28; G06F 11/00
(52) U.S. Cl. ......................................... 714/724; 714/811
(58) Field of Search .............................. 714/724, 725, 714/726, 727, 728, 732, 733, 734, 738, 741, 742, 798, 718, 719, 729, 730, 735, 744, 811; 710/20, 29, 58

(56) References Cited

U.S. PATENT DOCUMENTS 3,924,144 A * 12/1975 Hadamard .................. 307/303
4,730,317 A * 3/1988 Desyllas et al. .............. 371/25
5,610,926 A * 3/1997 Marris ........................ 714/726

\* cited by examiner

*Primary Examiner*—Christine T. Tu
(74) *Attorney, Agent, or Firm*—Rosenberg, Klein & Lee

(57) ABSTRACT

A chip testing system using an internal signal of the chip under test to produce a blanking signal so as to avoid a conflict in the turn-around cycle between input mode and output mode. The preceding signal, posterior signal and reverse phase signal of the output enable signal of the chip under test are used to match with a testing circuit for producing a blanking signal, which is driven only when the output enable signal is at a high potential, enabling the state machine in the chip to control data reading time, so as to avoid a conflict in the turn-around cycle between input mode and output mode.

13 Claims, 8 Drawing Sheets

CHIP TESTING SYSTEM

BACKGROUND OF THE INVENTION

The present invention relates to a chip testing system for testing the quality of chips, and more particularly to such a chip testing system which avoids reading in the conflict in the turn-around cycle between input mode and output mode by masking the conflict with a blanking signal obtained from an internal signal from the chip under test.

When a chip is fabricated, it must be tested before dispatching from the factory. The procedure of testing the quality of a chip through a regular tester is achieved by: using the channel of the tester to apply a test pattern to the chip through its I/O pin, then reading in output data from the I/O pin of the chip for comparison with expected value, and then making a quality judgment subject to the comparison result. FIG. 1 is a waveform chart obtained from the test of a chip through a conventional tester. During test, the tester uses a cycle signal with a test cycle of constant frequency to make test. As illustrated, a conflict occurs in the turn-around cycle between input mode and output mode. This happening may causes a damage to the chip and/or the tester. If state machine (SM) control signal comes from the pad of the chip, SM control signal is unstable in this turn-around cycle, thereby causing the state machine unable to work normally.

SUMMARY OF THE INVENTION

The present invention has been accomplished to provide a chip testing system which eliminates the aforesaid problems by avoiding to read in the conflict in the turn-around cycle between input mode and output mode during test. It is one object of the present invention to provide a chip test method which eliminates the occurrence of a conflict in the turn-around cycle between input mode and output mode when testing a chip. It is another object of the present invention to provide a chip testing circuit which avoid the occurrence of a conflict in the turn-around cycle between input mode and output mode when testing a chip. It is still another object of the present invention to provide a conflict eliminating chip testing circuit which can be built in the chip. The present invention uses the preceding signal, posterior signal and reverse phase signal of the output enable signal of the chip under test to match with a testing circuit for producing a blanking signal, which is driven only when the output enable signal is at a high potential, enabling the state machine in the chip to control data reading time, so as to avoid a conflict in the turn-around cycle between input mode and output mode.

DETAILED DESCRIPTION OF THE PREFERRED EMBODIMENT

When testing a chip, a conflict occurs only in the turn-around cycle between input mode and output mode. If the location of the turn-around cycle is detected, and a blanking signal can be inputted into the chip to mask the turn-around cycle, enabling the state machine to use the blanking signal in controlling the chip, causing the chip to read in data after a delay of one cycle or to end reading of data one cycle before a signal output.

Figure 1:
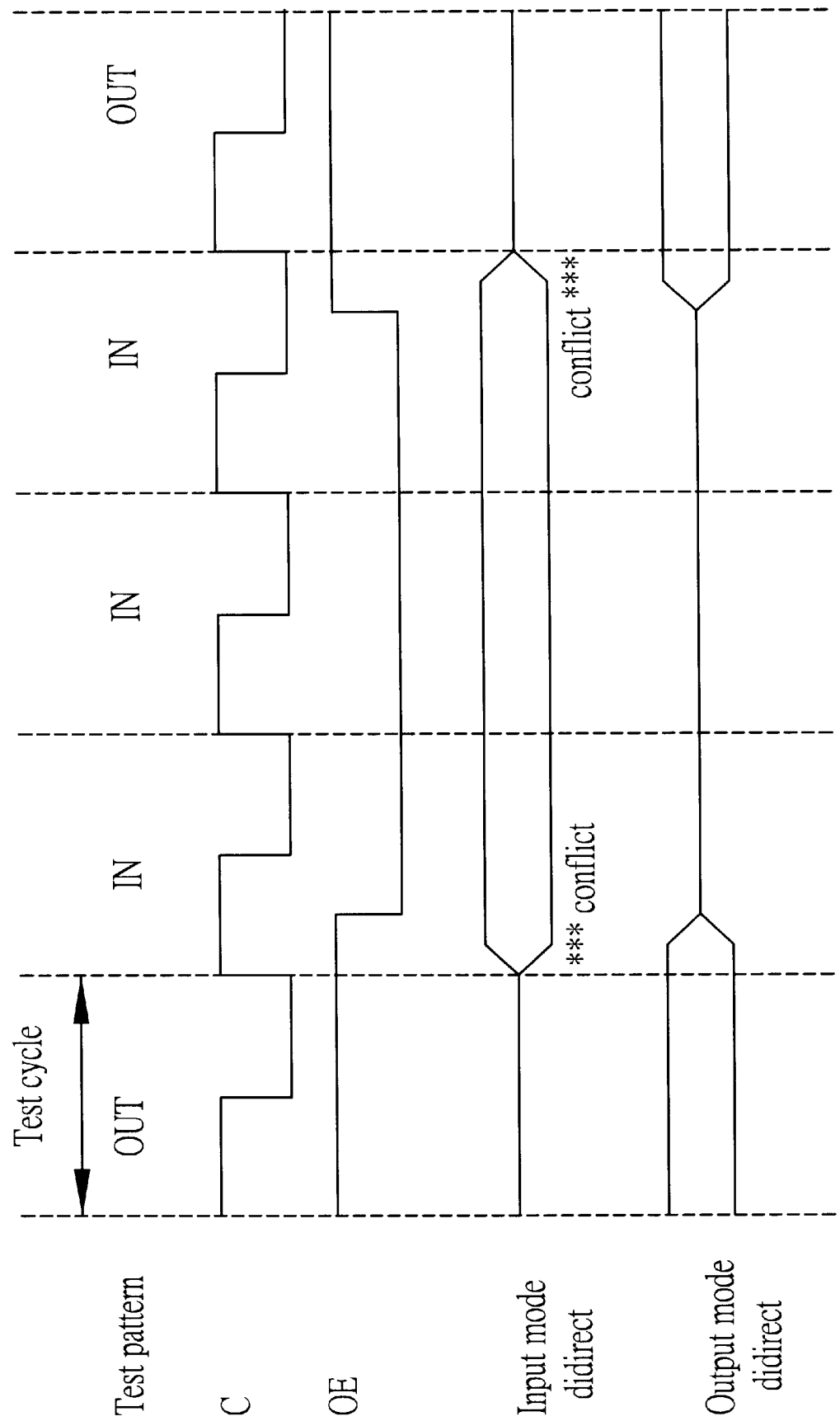
FIG. 1 is a waveform chart obtained from the test of a chip through a conventional tester.
Figure 2:
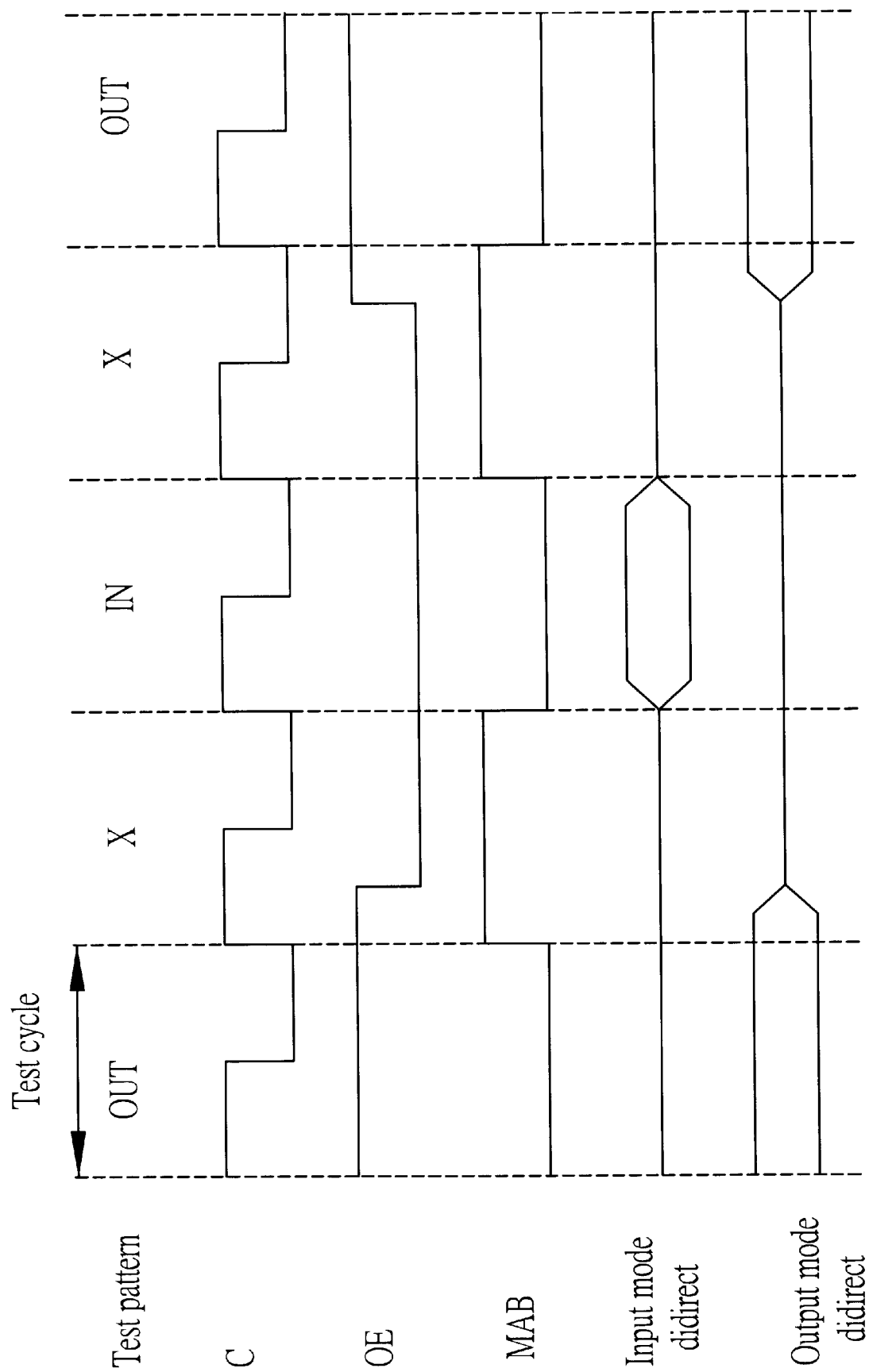
FIG. 2 is a waveform chart obtained from the test of a chip through a chip testing system according to the present invention.

Referring to FIG. 2, when the chip has data to be outputted, an output enable signal is started, By means of detecting this output enable signal, a blanking signal is properly produced to mask the conflict in the turn-around cycle between input mode and output mode.

Figure 3A:
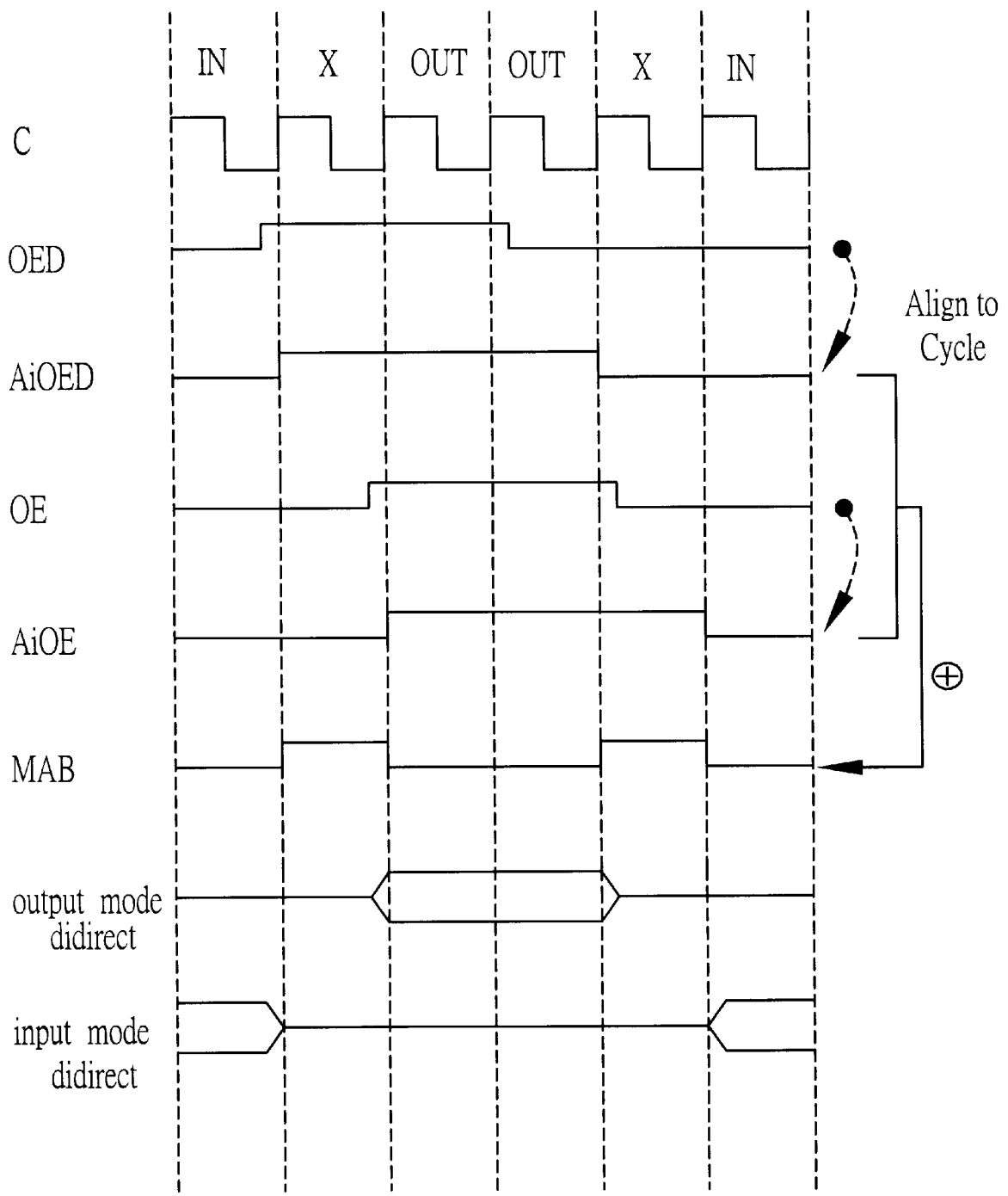
FIG. 3A is a waveform chart showing the production of a blanking signal according to a first method of the present invention.

FIG. 3A is a waveform chart showing the production of a blanking signal according to a first method of the present invention. The procedure of producing a blanking signal comprises the step of transferring output enable signal OE and the preceding signal OED backwards to the test cycle to form a first signal AiOE and a second signal AiOED, and the step of combining the first signal AiOE and the second signal AiOED to form a blanking signal MAB.

Figure 4A:
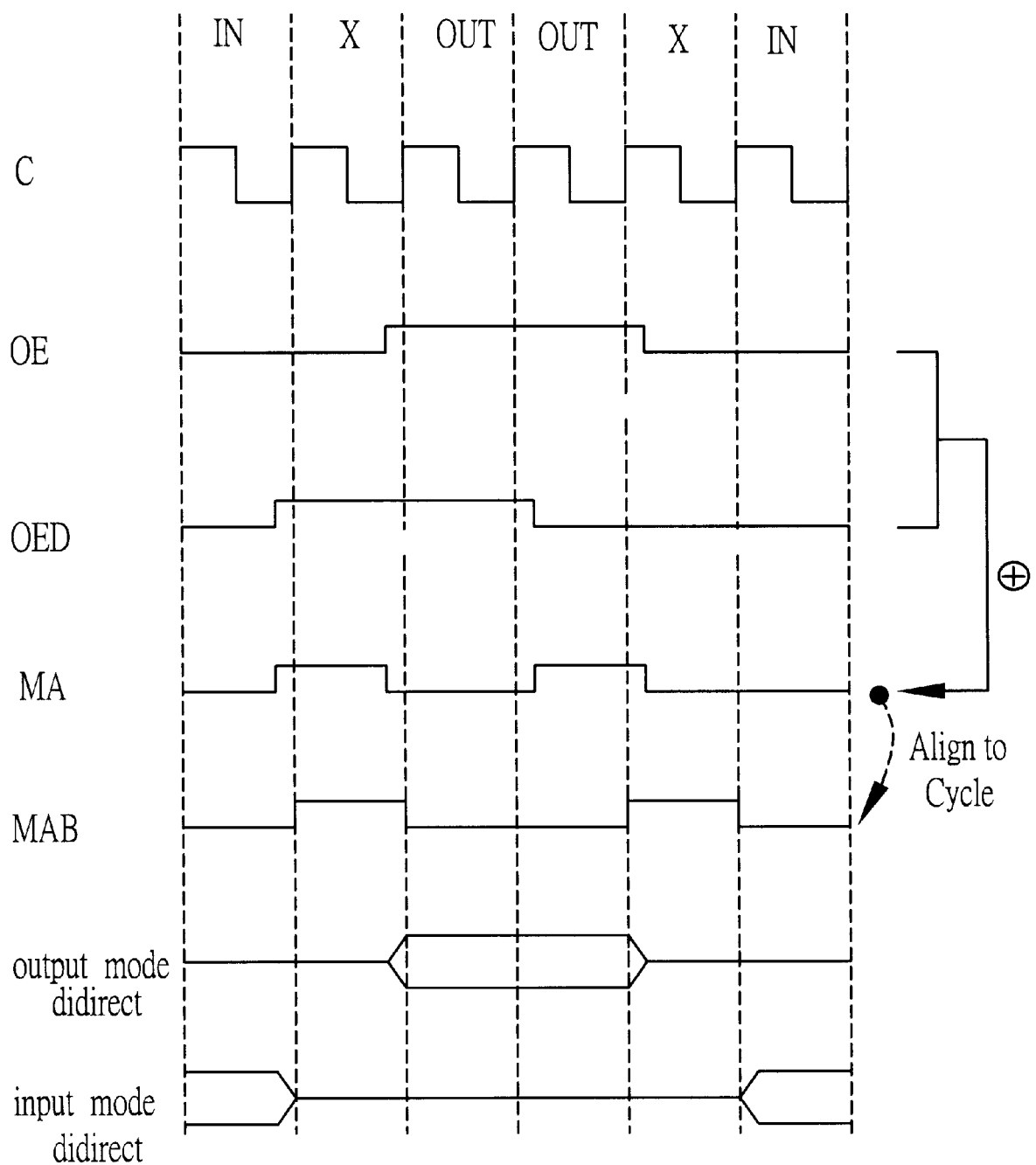
FIG. 4A is a waveform chart showing the production of a blanking signal according to a second method of the present invention.

FIG. 4A is a waveform chart showing the production of a blanking signal according to a second method of the present invention. This procedure comprises the step of combining output enable signal OE and the preceding signal OED to form a signal M, and the step of transferring the signal M thus obtained to the test cycle so as to produce a blanking signal MAB.

Figure 3B:
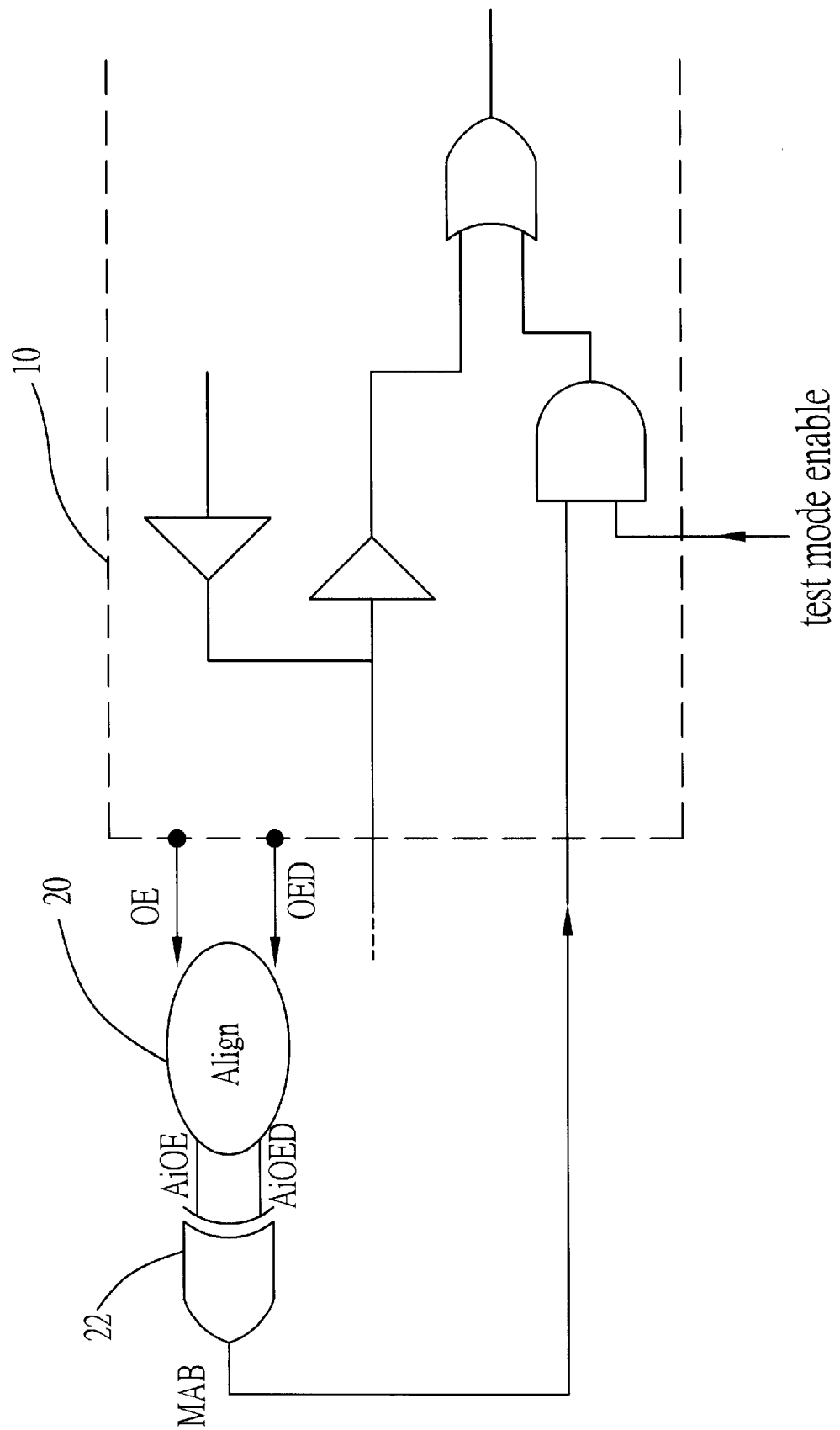
FIG. 3B is a circuit block diagram of a testing circuit for use with the first method of the present invention.

FIGS. 3B and 3B show a respective testing circuit for the procedures shown in FIGS. 3A and 4A. These testing circuits commonly comprise an align and a XOR.

In FIG. 3B, the align 20 receives output enable signal OE and the preceding signal OED from the chip 10 itself, and transfers the signals OE and OED backwards for synchronous output with the test cycle. The output signals AiOE and AiOED of the align 20 are combined in the XOR 22, causing the XOR 22 to output a blanking signal MAB.

Figure 4B:
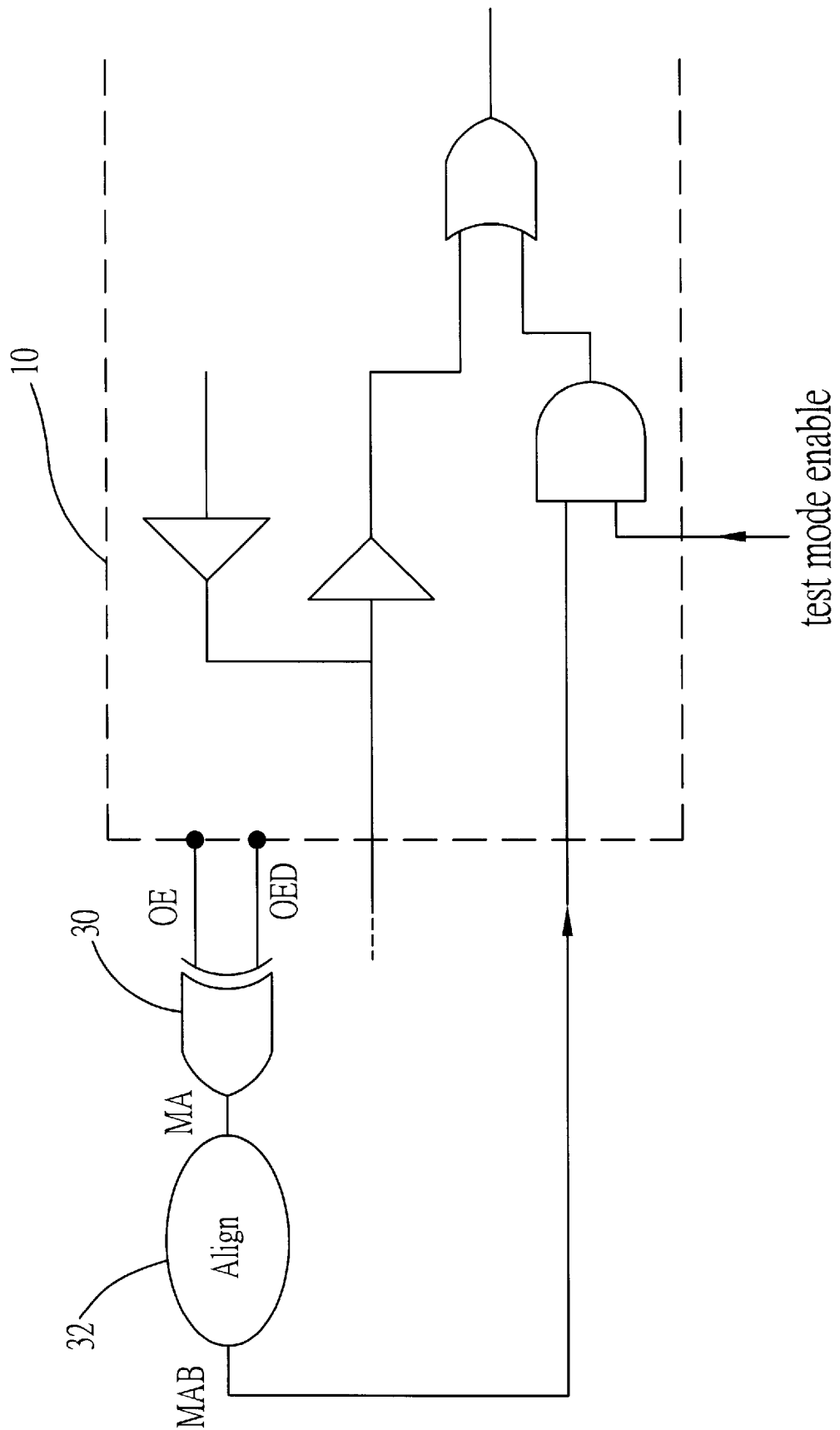
FIG. 4B is a circuit block diagram of a testing circuit for use with the second method of the present invention.

In FIG. 4B, the XOR 30 receives output enable signal OE and the preceding signal OED from the chip 10, and outputs a signal MA to the align 32, causing the align 32 to output a blanking signal MAB synchronous to the test cycle.

The align 20 or 32 achieves transfer of input signals and output of a blanking signal synchronous to the test cycle by: using the cycle signal C from the tester itself (see FIGS. 3A and 4A). If the cycle signal C and the signals inputted into the align 20 or 32 are "High" at the beginning of the cycle, the whole cycle output signal is "High". On the contrary, if the cycle signal C and the signals inputted into the align 20 or 32 are "Low" at the beginning of the cycle, the whole cycle output signal is "Low". By means of this method, the input signals to the align 20 or 30 can be changed, causing the align 20 or 30 to output an output signal synchronous to the test cycle.

When the blanking signal MAB generated from either of the aforesaid two testing systems is inputted into the chip, the state machine can than use this blanking signal MAB to control the chip, causing the chip to delay one cycle in reading in data, or to end data reading operation one cycle before its signal output, so as to eliminate a conflict, and to avoid a vague state machine signal.

Further, in the aforesaid methods of matching with an external circuit to produce a blanking signal MAB for inputting into the chip 10, the chip 10 needs to use additional pins for receiving the blanking signal MAB. It is complicated to make a chip having additional pins for receiving a blanking signal. Further, not all chips are suitable to be provided with additional pins for producing a blanking signal. Further, in order to use the internal output enable signal of the chip itself for producing a blanking signal for the chip state machine, the invention designs a testing system to be built in the chip.

Figure 5A:
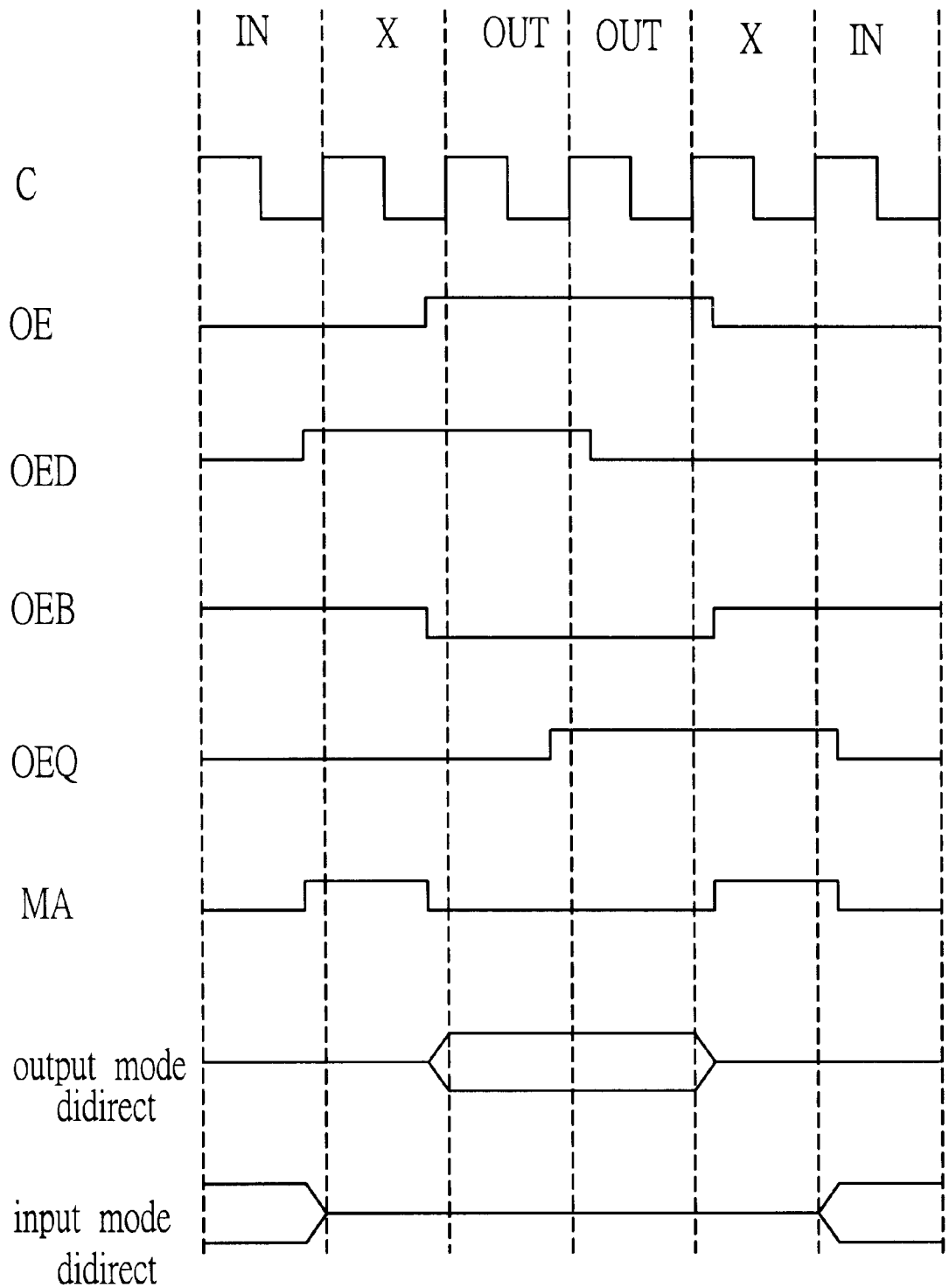
FIG. 5A is a waveform chart showing the production of a blanking signal according to a third method of the present invention.

FIG. 5A is a waveform diagram showing the production of a blanking signal according to a third method of the present invention. This procedure comprises the step of combining reverse phase signal OEB, the preceding signal OED and the posterior signal OEQ to form a signal MA, and the step of driving the signal MA thus obtained when the signals OED and OEB both are driven (High), or when the signals OEB and OEQ both are driven (High). Because no test cycle is needed inside the chip to match with the tester, the signal MA can be directly used a s a blanking signal MAB, and the state machine can directly use this signal MA to control the chip, causing the chip to delay one cycle in reading in data, or to end data reading operation one cycle before its signal output, so as to eliminate a conflict, and to avoid a vague state machine signal.

Figure 5B:
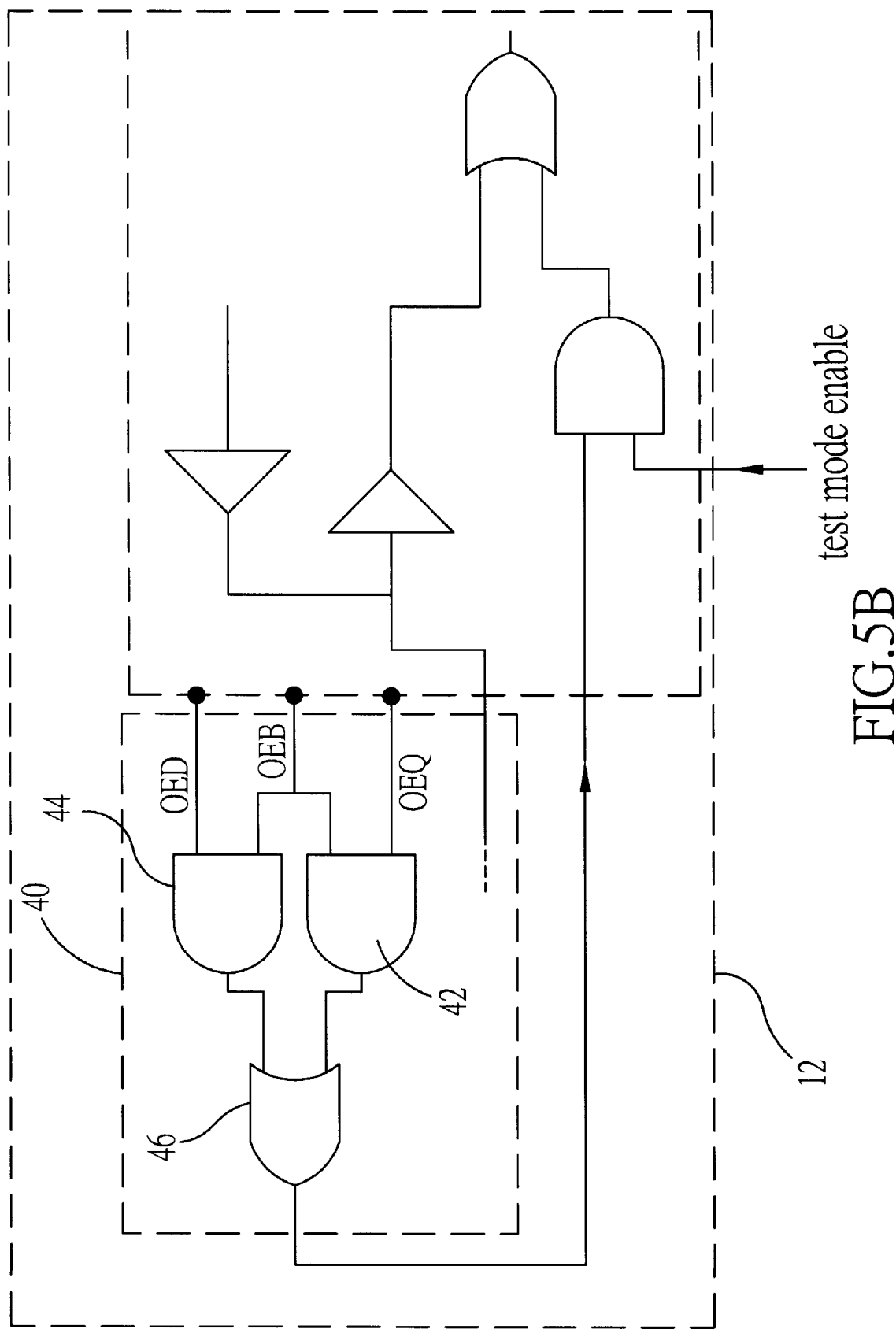
FIG. 5B is a circuit block diagram of a testing circuit for use with the third method of the present invention.

A testing circuit for use with the aforesaid third method is shown in FIG. 5B. The testing circuit 40 comprises two ANDs 44 and 42, and one OR 46. The input terminals of AND 44 are the proceeding signal OED and reverse phase signal OEB of the output enable signal OE. The output terminals of AND 42 are the posterior signal OEQ and reverse phase signal OEB of the output enable signal OE. The output terminals of the two ANDs 44 and 42 are input terminals of OR 46. The output terminal of OR 46 is the signal MA. Because the testing circuit 40 is built in the chip 12, the signal MA can directly be used as a blanking signal for input into the state machine. This chip avoids a conflict in the turn-around cycle between input mode and output mode, and needs not to use additional pins to achieve the production of the desired blanking signal.

As indicated above, the invention uses the reverse phase signal and the proceeding or posterior signal of the output enable signal of the chip itself to produce a blanking signal, so as to avoid a conflict in the turn-around cycle between input mode and output mode during test.

It is to be understood that the drawings are designed for purposes of illustration only, and are not intended as a definition of the limits and scope of the invention disclosed.

What the invention claimed is:

1. A chip testing system coupled to a chip for testing said chip's quality, said chip testing system applying an input test data to said chip in an input mode and reading an output test data in an output mode, said input and output test data having a predetermined test cycle, wherein a conflict occurs during a turn-around cycle between said input and output modes, said chip testing system comprising a testing circuit coupled to said chip to receive therefrom an output enable signal indicative of outputting said output test data and a preceding signal output prior to said output enable signal, said testing circuit generating a blanking signal responsive to input of said output enable signal and said preceding signal and supplying said blanking signal to said chip to control reading of said input test data, said blanking signal being output to delay said output mode after said input mode and delay said input mode after said output mode, thereby eliminating any effects from said conflict during said turn-around cycle.

2. The chip testing system of claim 1, wherein said testing circuit further comprises
   (a) an align unit receiving at inputs thereof said output enable signal and said preceding signal, said align unit producing first and second output signals from said received output enable and preceding signals, said first and second output signals being synchronized with said test cycle, and
   (b) an XOR gate having inputs thereof connected to outputs of said align unit, said XOR gate receiving said first and second output signals from said outputs of said align unit, and combining said first and second output signals to produce said blanking signal at an output thereof.

3. The chip testing system of claim 1, wherein said testing circuit comprises an XOR gate receiving said output enable signal and said preceding signal from said chip, and an align unit having an input thereof connected to an output of said XOR gate to receive an output signal from said XOR gate, and to generate said blanking signal.

4. The chip testing system of claim 1, wherein said testing circuit further includes an input for receiving a posterior signal output subsequent to said output enable signal, an d wherein said blanking signal is formed by combining an inverted version of said output enable signal, said preceding signal and said posterior signal, said blanking signal being at a high potential when both said preceding signal and said inverted version of said output enable signal are at a high potential and when both said posterior signal and said inverted version of said output enable signal are at a high potential thereat.

5. The chip testing system of claim 4, wherein said testing circuit includes a first AND gate, a second AND gate, and an OR gate, said preceding signal being applied to an input of said first AND gate, said inverted version of said output enable signal being applied to inputs of both said first and second AND gates, said posterior signal being applied to a n input of said second AND gate, said OR gate having input terminals respectively coupled to output terminals of said first AND gate and said second AND gate, said blanking signal being output from an output terminal of said OR gate.

6. The chip testing system of claim 1, wherein said testing circuit is disposed on said chip being tested.

7. A chip test system comprising:
   a tester for outputting an input test data in an input mode and reading an output test data in an output mode, wherein said input and output test data have a predetermined test cycle;
   a chip coupled to said tester for reading said input data in said input mode and outputting said output data in said output mode; and
   a testing circuit coupled to said chip for generating a blanking signal responsive to a plurality of signals generated by said chip to control reading of said input test data;
   wherein said blanking signal is output to delay said output mode after said input mode and to delay said input mode after said output mode, thus eliminating a conflict that occurs during a turn-around cycle between said input and output modes.

8. The chip testing system of claim 7, wherein said signals comprise an output enable signal indicative of outputting said output test data and a preceding signal output prior to said output enable signal.

9. The chip testing system of claim 8, wherein said signals further comprise a posterior signal output subsequent to said output enable signal, and wherein said blanking signal is formed by combining an inverted version of said output enable signal, said preceding signal and said posterior signal, said blanking signal being at a high potential when both said preceding signal and said inverted version of said output enable signal are at a high potential and when both said posterior signal and said inverted version of said output enable signal are at a high potential thereat.

10. The chip testing system of claim 9, wherein said testing circuit includes a first AND gate, a second AND gate and an OR gate, said preceding signal being applied to an input of said first AND gate, said inversion version of said output enable signal being applied to inputs of both said first and second AND gates, said posterior signal being applied to an inputs of said second AND gate, said OR gate having input terminals respectively coupled to output terminals of said first AND gate and said second AND gate, said blanking signal being output from an output terminal of said OR gate.

11. The chip testing system of claim 8, wherein said testing circuit further comprises:

(a) an align unit receiving at inputs thereof said output enable signal and said preceding signal, said align unit producing first and second output signals from said received output enable and preceding signals, said first and second output signals being synchronized with said predetermined test cycle, and (b) an XOR gate having inputs thereof connected to outputs of said align unit, said XOR gate receiving said first and second output signals from said outputs of said align unit, and combining said first and second output signals to produce said blanking signal at an output thereof.

12. The chip testing system of claim 7, wherein said testing circuit comprises an XOR gate receiving said output enable signal and said preceding signal from said chip, and an align unit having an input thereof connected to an output of said XOR gate to receive an output signal from said XOR gate, and to generate said blanking signal.

13. The chip testing system if claim 7, wherein said testing circuit is disposed on said chip being tested.

* * * * *